United States Patent
Chen et al.

(10) Patent No.: US 12,163,091 B2
(45) Date of Patent: Dec. 10, 2024

(54) THERMAL INTERFACE MATERIAL

(71) Applicant: HENKEL IP & HOLDING GMBH, Duesseldorf (DE)

(72) Inventors: Yu Chen, Glastonbury, CT (US); Lynnette M. Hurlburt, Manchester, CT (US); Andrew D. Messana, Newington, CT (US); Kevin J. Welch, Wallingford, CT (US); Robert Parkins Cross, Rocky Hill, CT (US)

(73) Assignee: Henkel AG & Co. KGaA, Duesseldorf (DE)

( * ) Notice: Subject to any disclaimer, the term of this patent is extended or adjusted under 35 U.S.C. 154(b) by 856 days.

(21) Appl. No.: 17/195,722

(22) Filed: Mar. 9, 2021

(65) Prior Publication Data

US 2021/0189213 A1 Jun. 24, 2021

Related U.S. Application Data

(63) Continuation of application No. PCT/US2019/050547, filed on Sep. 11, 2019.

(60) Provisional application No. 62/729,496, filed on Sep. 11, 2018.

(51) Int. Cl.
*C09K 5/14* (2006.01)
*C08G 77/442* (2006.01)

(52) U.S. Cl.
CPC .............. *C09K 5/14* (2013.01); *C08G 77/442* (2013.01)

(58) Field of Classification Search
CPC ......... C09K 5/14; C08G 77/442; C08L 23/18; C08L 23/20; C08L 23/22; C08L 23/26; C08L 83/04; C08L 83/06; C08L 83/08; C08L 101/10

See application file for complete search history.

(56) References Cited

U.S. PATENT DOCUMENTS

| | | | | |
|---|---|---|---|---|
| 3,814,730 | A * | 6/1974 | Karstedt | C08G 77/398 528/30 |
| 6,320,010 | B1 * | 11/2001 | Sakaguchi | C08K 5/5419 528/25 |
| 7,195,720 | B2 * | 3/2007 | Sakaguchi | C08K 5/5419 252/511 |
| 2003/0160207 | A1 | 8/2003 | Sakaguchi | |
| 2005/0049357 | A1 * | 3/2005 | Zhong | H01L 23/3737 524/588 |
| 2006/0189767 | A1 * | 8/2006 | Bhagwagar | C08F 283/12 525/477 |
| 2015/0361320 | A1 * | 12/2015 | Tang | C08L 83/06 252/78.3 |
| 2015/0376488 | A1 * | 12/2015 | Tan | C08L 83/14 252/78.3 |
| 2016/0032060 | A1 | 2/2016 | Jiang et al. | |
| 2021/0189213 | A1 | 6/2021 | Chen et al. | |

FOREIGN PATENT DOCUMENTS

| | | | | |
|---|---|---|---|---|
| JP | | 2000124475 A * | 4/2000 | |
| WO | WO-2018151033 A1 * | 8/2018 | | C09K 5/14 |
| WO | | 2020055961 A1 | 3/2020 | |

* cited by examiner

*Primary Examiner* — Matthew R Diaz
(74) *Attorney, Agent, or Firm* — Steven C. Bauman

(57) ABSTRACT

Provided herein is a composition for use as a thermal interface material in a heat-generating device. The composition comprises a first part and a second part, the first part comprising polyisobutylene, a reactive diluent mixture, a catalyst, and one or more thermally conductive fillers, and the second part comprising polyisobutylene, the reactive diluent mixture, a silicone based cross-linker, an inhibitor and one or more thermally conductive fillers.

21 Claims, No Drawings

THERMAL INTERFACE MATERIAL

FIELD OF THE INVENTION

This invention relates generally to a thermally conductive material that absorbs and dissipates transferred heat between a heat-generating device and a heat sink.

BACKGROUND OF THE INVENTION

Thermal management materials or thermal interface materials are widely utilized in the electronics industry for operably coupling heat-generating components to heat-sinking structures. Most typically, these thermal interface materials are utilized in connection with heat-generating electronic components such as integrated circuits (IC), central processing units (CPU), and other electronic components. Generally, excess thermal energy generated by the heat-generating component may be expelled to the heat sinking structures via the thermal interface material.

To maximize the heat transfer from the heat-generating electronic devices to the heat-sinking structure, the thermal interface material provides an intimate contact between the two elements to facilitate heat transfer. Commonly, either a paste-like thermally conductive material, such as silicone grease, or a sheet-like thermally conductive material, such as silicone rubber is utilized as the thermal interface material.

These thermal interface materials have drawbacks that present obstacles during their use. Commonly, these thermal interface materials are made by dispersing thermally conductive fillers in a polymer matrix and many thermal interface materials contain silicon. Silicon-containing thermal interface materials have issues with bleeding and outgassing and thus can contaminate the device. Non-silicon containing thermal interface materials can suffer from low thermal conductivity and high hardness.

Thus, there remains a need for a thermal interface material that is easy to handle and apply, provides a low thermal resistance, high thermal conductivity, low hardness, and prevents silicon bleeding.

SUMMARY OF THE INVENTION

A composition for use as a thermal interface material in a heat-generating electronic device is provided. The composition comprises a first part and a second part. The first part comprises polyisobutylene, a reactive diluent mixture, a catalyst, and one or more thermally conductive fillers. The second part comprises polyisobutylene, the reactive diluent mixture, a silicone based cross-linker, an inhibitor, and one or more thermally conductive fillers. The reactive diluent mixture comprises one or more diluent with a mono-substituted alkene structure, and one or more diluent with a multi-substituted alkene structure and the ratio of mono-substituted alkene structure diluents to multi-substituted alkene structure diluents is in the range of 1:1 to 4:1. Thermally conductive fillers can be present in the composition in an amount of 90 wt. % or greater based on the total weight of the composition.

Another aspect of the present invention provides an electronic device comprising a heat-generating component, a heat sink, and the thermal interface material according to the above description disposed therebetween.

DETAILED DESCRIPTION OF THE INVENTION

Provided herein is a new organic-based thermal interface material ("TIM"). Compared to existing TIM materials, this new material shows very low viscosity before cure and low hardness after cure, further the material exhibits higher thermal conductivity, increased filler loading, good thermal stability, and no bleed or migration during thermal testing. Further, the TIM disclosed herein is easy to handle and apply and provides a low thermal resistance.

The thermal interface material provided herein is a composition made up of a first part and a second part that is flowable before cure and cures in place after application. The first part and the second part are mixed in place to form the thermal interface material. As described in detail below, the order of application and/or mixing of the first part and the second part is not limited, "first" and "second" are used throughout only to distinguish between the two parts.

The first part of the composition comprises polyisobutylene ("PIB"), a reactive diluent mixture, a catalyst, and one or more thermally conductive fillers. The second part of the composition comprises polyisobutylene, the reactive diluent mixture, a silicone based cross-linker, an inhibitor and one or more thermally conductive fillers.

Polyisobutylene ("PIB") is used in the present composition in both the first part and in the second part. The polyisobutylene interacts with the reactive diluent mixture to yield desired properties of each of the first part and the second part and thus the desired properties of the overall composition.

Polyisobutylenes that can be used herein include homopolymers of isobutylene bearing double bond at two ends. They can also be called polybutene and butyl rubbers. They usually contain less than 75% monofunctional terminal alpha olefins per polymer chain. The PIB can include any other functional groups as terminal groups including but not limited to acrylate, (meth)acrylate, styrenic C=C bonds, diallyl, maleic anhydride, and the like. Commercially available PIB include, but not limit to, EP200A, EP400A, EP600A, Oppanol, Glissopal, and Indopol. Moreover, the weight average molecular weight ("MW") of the PIB ranges from about 1,000 to about 95,000 Da.

The composition further includes a reactive diluent mixture in both the first part and the second part. The reactive diluent mixture includes two reactants, one of which has a fast reaction rate and one of which has a slow reaction rate with siloxane including compounds that bear unsaturated double or triple bond functionalities such as carbon-carbon bonds, carbon-oxygen bonds, carbon-nitrogen bonds, nitrogen-nitrogen bonds, and nitrogen-oxygen bonds.

Specifically, the reactive diluent mixture comprises one or more diluents with a mono-substituted alkene structure (fast reaction rate), and one or more diluents with a multi-substituted alkene structure (slow reaction rate). Compounds useful as reactive diluents can include but are not limited to alkenes, alkynes, (meth)acrylates, carboxylates, imines, cyanoacrylates, diazenes, sulfoxides, etc.

For example, the mono-substituted diluents in the reactive diluent mixture can comprise low viscosity terminal olefin (1-alkene) with various carbon number or monofunctional acrylate/methacrylate with low viscosity. The multi-substituted diluents in the reactive diluent mixture can comprise low viscosity 1,1-disubstituted olefin with total carbon number from 12 to 24.

A particularly useful reactive diluent mixture includes one or more diluents having at least one of the following structures:

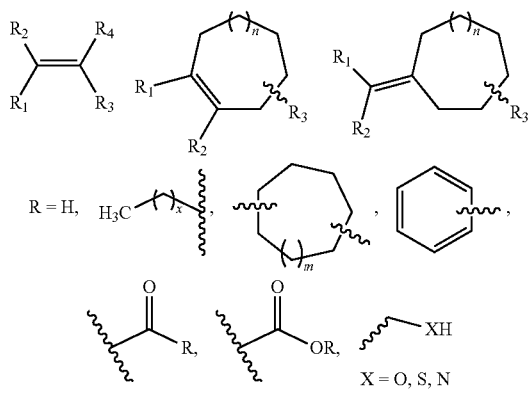

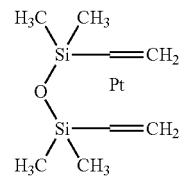

The reactive diluent mixture allows for tuning of the properties of the resulting composition by changing the ratio of the mono-substituted diluents to multi-substituted diluents. For example, the ratio of mono-substituted diluents to multi-substituted diluents can be optimized to achieve a good work life of the composition.

A particularly useful ratio of mono-substituted alkene structure diluents to multi-substituted alkene structure diluents is in the range of 1:1 to 4:1.

The composition may further include alkene-based diluents containing multiple alkenyl or other functional groups with varying reactivity. For example, a composition may include a diene-based diluent where one reactive alkenyl group participates in the hydrosilation reaction and other functional group that will not participate in the hydrosilyation reaction.

The molar ratio of polyisobutylene to reactive diluent mixture can be adjusted to control the hardness of the composition. In a particularly useful embodiment, the molar ratio of PIB to reactive diluent mixture is in the range of 15:1 to 31:1.

The catalyst used herein is included in the first part of the composition. The catalyst is used to initiate the reaction with the silicon containing compound. Catalysts that are useful herein can be any catalyst generally known to be suitable for a hydrosilyation, hydroamination, hydroacrylation, or hydrophosphination reaction. For example, the catalyst can be a platinum group metal catalyst, such as platinum, rhodium, ruthenium, palladium, osmium or iridium metal or organometallic compound thereof, or a combination thereof. The platinum catalyst may be selected from chloroplatinic acid, alcohol modified chloroplatinic acids, olefin complexes of chloroplatinic acid, complexes of chloroplatinic acid and divinyltetramethyldisiloxane, fine platinum particles adsorbed on carbon carriers, platinum black, platinum acetylacetonate, platinous halides exemplified by PtCb, PtCU, Pt(CN)2, complexes of platinous halides with unsaturated compounds exemplified by ethylene, propylene, and organovinylsiloxanes, styrene hexamethyldiplatinum, RhCl3(Bu2S)3, Speier's catalyst, Wilkinson's catalyst, Grubbs' catalyst and Karstedt's catalyst. Karstedt's catalyst is prepared by reacting a platinum halide or platinum halide complex with an unsaturated organosilicon compound under reaction conditions such that the halogen in such complex is reduced to no more than one halogen atom per platinum atom. In a preferred embodiment, the catalyst used herein can be Karstedts's catalyst. The structure of Karstedt's catalyst is shown below When the catalyst used is Karstedt's catalyst it is included in the first part an amount of 10 to 100 ppm.

The TIM of the present invention can include any of a plurality of different thermally or electrically conductive fillers to provide desired characteristics to the resulting composition.

Examples of suitable thermally conductive filler materials include silver, aluminum, copper, boron nitride, aluminum nitride, silver coated copper, silver coated aluminum, copper coated aluminum, diamond, etc. Various additional thermally conductive filler materials that will be apparent to one skilled in the art may also be employed.

The filler included in the composition can also be electrically conductive filler. The electrically-conductive filler is ordinarily one selected from graphite, diamond, silver, and copper. Alternatively, the electrically-conductive filler may be aluminum, such as a spherical alumina.

Increasing the filler loading can yield increased compositions with increased thermal conductivity. However, it is generally known that increased filler loading in thermal interface material compositions can increase hardness and viscosity of the resulting composition, making it undesirable. The inventive composition contemplates a high amount of filler loading, yielding excellent thermal properties without realizing the typical drawbacks of increased filler loading such as increased hardness and viscosity. In a particularly useful embodiment, thermally conductive fillers are present in the composition in an amount of 90 wt. % or greater, for example 94 wt. % or greater based on the total weight of the composition.

The composition further includes a cross linker in the second part. For example, the composition can include a silicone-based cross linker, a molecule containing Si—H groups, or thiol-based cross linkers, a molecule containing S—H groups, or amine-based cross linker, a molecule containing N—H groups, or phosphorus-based cross-linker, or a molecule containing P—H groups. Silicon-based cross-linkers are particularly useful.

The chain length of the cross-linker can change the distance between the molecules in the hydrosilyation reaction. Accordingly, the chain length and the Si—H group number per molecular on the silicon-based cross-linker can be optimized to control the cross-link density.

For example, the silicon based cross-linker can include at least 3 Si—H groups in each single molecular chain with a greater than or equal to one long alkyl or phenyl side chain structure. Particularly useful silicon based cross-linkers include at least 17 Si—H groups in each single molecular chain. More specifically, the silicon based cross-linker for use in the present application can be a siloxane.

The molar ratio of the silicon based cross-linker to polyisobutylene can be adjusted to control the hardness of the composition. A particularly useful molar ratio of silicon based cross-linker to polyisobutylene is in the range of 1:0.4 to 1:1.

The composition disclosed herein includes an inhibitor in the second part. The type of inhibitor used can be chosen from a wide range of inhibitors generally known in the art. For example, the inhibitor can preferably be a phenol type inhibitor or an aniline type inhibitor. Specifically, phenolic antioxidants are useful in the inventive composition as inhibitors, such as 4-tert-Butylcatechol, BHT, 2-BHA, 3-BHA, Gallate, BNX1225, BNX1010, and Irganox 1010.

The inhibitor can be present in the composition in any amount, for example the inhibitor can be included in the second part in an amount of greater than or equal to 1 ppm.

Optionally, a rheology additive can also be included in the composition. For example, the rheology additive can be included in the composition to control the viscosity of the composition so that the composition can be useful in various applications with viscosity limitations.

When the first part and second part are mixed, the components in each part react yielding the composition disclosed herein.

In particular, the silicon-based cross linker will react with the monofunctional diluent, the multi-functional diluent, and the PIB. Each reaction will occur at a different reaction rate, which is why the amount of each component can be modified to adjust the properties of the resulting composition. When the first part and second part are mixed, the fastest reaction will be the reaction of the monofunctional diluent with the silicon cross linker. This reaction replaces the silicon hydride group on the silicon-based cross linker. As the silicon hydride groups on the silicon-based cross linker are replaced, the reaction rate will be slowed, by which the work life of the material is extended. Once the monofunctional diluent is reacted and the silicon hydride groups are replaced, the reactivity drops without a significant change of the viscosity. Next, the PIB and the multi-functional diluent will begin reacting with the remaining silicon hydride groups on the silicon-based cross linker. The synthetic scheme below shows one example of a reaction that may occur when the first part and second part of the composition are mixed.

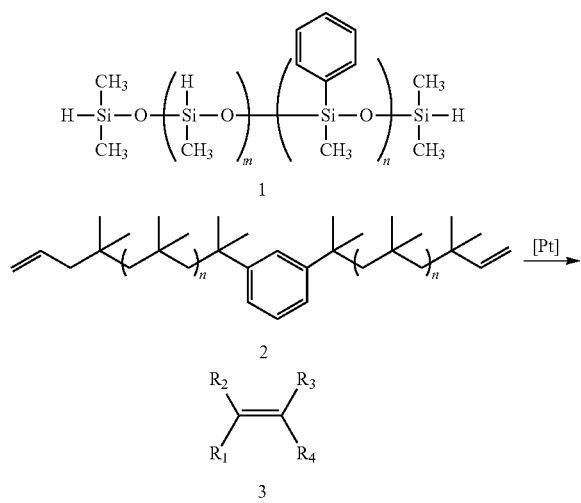

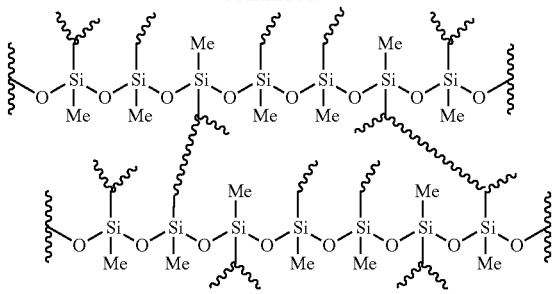

The cross-link density of the resulting product is reduced, thereby lowering the hardness of the final product. This allows for increased filler loading in the composition without the some of the typical drawbacks associated with high filler loading such as increased viscosity and hardness.

The first part and the second part of the composition are dispensed separately onto a substrate, specifically onto a heat-sinking element of an electronic device. As described above, each of the first part and second part is flowable before cure. The viscosity of the first part and second part can each be tuned by changing the amounts of each component and optimized based on the dispenser being used or method of dispensing that is employed. For example, if each part is sprayed onto the substrate a lower viscosity is desirable and the amount of each component can be modified to ensure a lower viscosity is achieved to allow spray application. In a particularly useful embodiment, the first part and the second part each have a flow rate of greater than 20 g/min at 85-90 psi before cure.

The ratio of the first part and the second part can be tuned to adjust the properties of the overall composition. For example, the ratio of the first part to the second part can be about 1:1 by volume.

The first part and the second part can be mixed upon application, such that curing begins when the first part and second part are both applied. The application of the first part and the second part can be in any order or simultaneously. Gelation can begin to occur once the first part and second part are mixed, such that the viscosity of the mixture will increase. Once gelation begins, the mixture of the first part and the second part will remain in place. In a particularly useful embodiment, the composition has a flow rate of greater than 20 g/min at 85-90 psi, before curing begins. The composition is capable of cure at room temperature to yield a thermal interface material.

After mixture and curing, the composition will have desirable properties for thermal interface material applications. Specifically, the composition will have low hardness (Shore 00 of 0-85, specifically 45-60) and high conductivity of greater than 3 W/mK. After curing at room temperature, the composition exhibits 0.3% weight loss at up to 50° C. measured with thermogravimetric analysis ("TGA"). In addition, after curing, the composition exhibits thermal stability up to 125° C., measured using thermal shock from −40° C. to 125° C. after 1000 hour cycles, the conductivity is lowered by less than about 2%.

The invention disclosed herein also contemplates an electronic device comprising a heat-generating component, a heat sink, and the inventive composition disposed therebetween.

In a useful embodiment there is no air disposed between the heat-generating component and the heat sink when the composition described herein is disposed in between them.

This is because the material described herein has a very good wetting property and low viscosity on the surface so that when the composition is applied, air between the heat-generating component and heat sink will be forced out, and no air will be trapped. For example, the composition described herein can be applied onto a heat-generating component or a heat sink using two-component (2K) mixing system.

EXAMPLES

Example 1: Creation of a TIM Material

To create a TIM material according to the composition described herein, conductive fillers (91-94 wt. %) are combined with siloxane 1 (HPM 502 from Gelest), PIB 2 (EP200A or EP400A from Kanaka) and a combination of mono-functional olefin 3 (ENEM2230 from Gelest and 1-Hexedecene from TCI), hydrosilation catalyst (Karstedt's Catalyst) and inhibitor (4-tert-Butylcatechol). The combined material cures at room temperature to give a thermal interface material according to the following reaction.

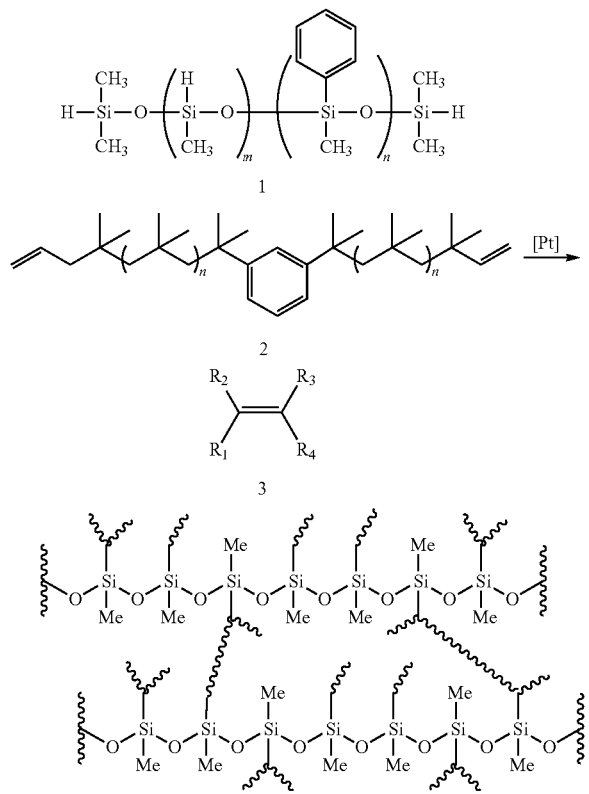

The mole ratio of HPM502:PIB:Diluent in the resulting composition is 2:(1.108~2):(31.784~30).

The sample was tested for desired properties. At 85° C. and 85% humidity for 1000 hours, the sample showed no change in conductivity. In dynamic headspace GC/MS analysis the sample did not exhibit siloxane outgassing.

Further, there were no visible changes in the IR spectra after one week at 125° C., indicating thermal stability of the sample at 125° C.

Example 2: Hardness Control

Table 1 shows compositions used for testing hardness control. The compositions of Table 1 were created in the same way as the composition in Example 1, above. Table 1 shows the moles of each component included in the composition.

TABLE 1

| | Formulation | | | |
|---|---|---|---|---|
| | A | B | C | D |
| Polyisobutylene MW5000 | 2 | 2 | 0.5 | 0 |
| Polyisobutylene MW10000 | 0 | 0 | 0 | 0.5 |
| 45-50% methylhydrosiloxane | 2 | 2 | 2 | 2 |
| 1-Hexedecene | 30 | 0 | 0 | 0 |
| (10Z)-10-Icosene | 0 | 30 | 33 | 33 |
| Result | No gelation | Hard gelation | Soft gelation | Softer than C |

First, a formulation of resin with Polyisobutylene (MW=5000), 45-50% methylhydrosiloxane and 1-hexedecane in Formula A was formulated as a benchmark. As expected, no gelation was observed in Formula A.

The 1-hexedecene in Formula A was replaced with (10Z)-10-Icosene in the same molar ratio in Formula B and gave a hard gelation with a Shore00 of >75. The replacement of 1-hexedecene with (10Z)-10-Icosene in Formula B demonstrates that the reactivity rate of mono-functional alkene played an important role by slowing down the reaction rate of the mono-functional alkene. However, the hardness of the resulting gel in Formula B demonstrates that the crosslink density may still be too high.

In Formula C, the loading of Polyisobutylene MW5000 was reduced by about 25% and it was found that good gelation can still be achieved even when the loading is reduced.

In Formula D, Polyisobutylene MW10000, which is generally not used due to high viscosity, was used in place of Polyisobutylene MW5000. With 0.5 equivalent of Polyisobutylene MW10000, the resulting resin still showed very low viscosity, which can be explained by the use of the reactive diluent mixture in the formulation. With the doubled chain length, Polyisobutylene MW10000 provided even less cross link density than Polyisobutylene MW5000, therefore the hardness is lower.

Example 3: Gelation

Using Formula A as the benchmark, which did not show gelation with 1-hexedecene at the desired formulation ratio in Table 1 above, (10Z)-10-Icosene was added in Formula F. Gelation was achieved in formula G with much lower PIB loading (drop from 2 to 0.5) shown in Table 2 below.

TABLE 2

| | Formulation | | | | |
|---|---|---|---|---|---|
| | A | E | F | G | H |
| Polyisobutylene MW 5000 | 2 | 2 | 0.5 | 0 | 2 |
| Polyisobutylene MW1000 | 0 | 0 | 0 | 0.5 | 0 |
| 45-50% methylhydro-siloxane | 2 | 2 | 2 | 2 | 2 |
| 1-Hexadecene (C16H32) | 30 | 0 | 0 | 0 | 0 |

TABLE 2-continued

| | Formulation | | | | |
|---|---|---|---|---|---|
| | A | E | F | G | H |
| (10Z)-10-Icosene | 0 | 30 | 33 | 33 | 0 |
| 7-Methylene-pentadecane | 0 | 0 | 0 | 0 | 30 |
| Results | No gelation | ShoreOO ~70 | ShoreOO ~60 | ShoreOO ~50 | ShoreOO ~65 |

7-Methylenepentadecane was also tested in Formula H, as it is readily available and has a similar structure to (10Z)-10-Icosene with a smaller carbon number. Formula H with 7-Methylenepentadecane showed gelation as well, but slightly less hardness than that of (10Z)-10-Icosene, which indicating that the reactivity of reactive diluent impacts the crosslink density, contributing to the final hardness of the material.

Example 4: Extended Work Life

Using Formula H as the benchmark because Formula H includes 7-Methylenepentadecane, the loading of 1-hexadecene was increased in Formula I. No significant work life extension was observed, even when a 1:1 ratio of 1-hexadecene and 7-Methylenepentadecane was used in Formula J. No hardness increasing was observed, either. However, when the 1-hexadecene: 7-Methylenepentadecane ratio is increased to about 3:1, an increased work life (from about 2 minutes to about 30 minutes) was observed in Formula K, shown in Table 3 below.

TABLE 3

| | Formulation | | | |
|---|---|---|---|---|
| | H | I | J | K |
| Polyisobutylene MW5000 | 2 | 2 | 2 | 2 |
| 45-50% methylhydrosiloxane | 2 | 2 | 2 | 2 |
| 1-Hexadecene | 0 | 7.5 | 15 | 22.5 |
| 7-Methylenepentadecane | 30 | 22.5 | 15 | 7.5 |
| Work life | ~2 min | ~2 min | ~2 min | >30 min |

Example 5: Work Life, Conductivity, Filler Loading, Hardness, and Viscosity Results of Formulation

TABLE 4

| POLYMETHYLHYDROSILOXANE C7H22O2SI3 |
|---|
| 1 g Polyisobutylene MW5000 |
| 0.885 g C1618 alpha olefin |
| 1.346 g 2% Karstedt's catalyst solution |
| 0.0194 g Conductive Filler |
| 37.167 g |

The formulation shown above in Table 4 was mixed according to the method described in Example 1 and the work life, conductivity, initial hardness, and viscosity were tested. The formulation in Table 4 had a work life >60 min at room temperature, conductivity reached 3.3 W/mK with ASTM D5740, and an initial hardness at 60-70 Shore 00, Tg at −82° C., Td at 431° C., flow rate of more than 60 g/min.

What is claimed is:

1. A composition comprising:
   a first part comprising polyisobutylene, a reactive diluent mixture, a catalyst, and one or more thermally conductive fillers, and
   a second part comprising polyisobutylene, the reactive diluent mixture, a silicone based cross-linker, an inhibitor and one or more thermally conductive fillers,
   wherein the reactive diluent mixture comprises one or more diluents with a mono-substituted alkene structure comprising a terminal olefin, and one or more diluents with a multi-substituted alkene structure comprising a 1,1-disubstituted olefin with 12-24 carbon atoms, and
   wherein a molar ratio of the one or more mono-substituted alkene structure diluents to the one or more multi-substituted alkene structure diluents is about 3:1,
   wherein a molar ratio of the combined polyisobutylene of the first and second parts to the combined reactive diluent mixture of the first and second parts is from about 15:1 to about 31:1 and
   wherein the thermally conductive fillers of the first part and the second part are present in the composition in an amount of 90 wt. % or greater based on the total weight of the composition.

2. The composition of claim 1, wherein the mono-substituted alkene structure comprises 1-hexadecene, and the multi-substituted alkene structure comprises 7-methylenepentadecane.

3. The composition of claim 1, wherein the silicone based cross-linker has at least 3 Si—H groups in each single molecular chain.

4. The composition of claim 1, wherein the silicone based cross-linker has at least 17 Si—H groups in each single molecular chain.

5. The composition of claim 1, wherein the silicone based cross-linker is a siloxane.

6. The composition of claim 1, wherein the molar ratio of silicone based cross-linker to polyisobutylene is in the range of about 1:0.4 to about 1:1.

7. The composition of claim 1, wherein the catalyst is included in an amount of 10 to 100 ppm.

8. The composition of claim 1, wherein the inhibitor is included in an amount of greater than about 1 ppm.

9. The composition of claim 1, wherein the catalyst is any catalyst suitable for a hydrosilation reaction.

10. The composition of claim 1, wherein the catalyst is Karstedt's catalyst.

11. The composition of claim 1, wherein the inhibitor is a phenolic inhibitor.

12. The composition of claim 11, wherein the inhibitor comprises 4-tert butylcatechol or a sterically hindered phenolic antioxidant.

13. The composition of claim 1, wherein after curing at room temperature the composition exhibits 0.3% weight loss at up to 50° C.

14. The composition of claim 1, wherein after curing the composition exhibits thermal conductivity of at least 3 W/mK.

15. The composition of claim 1, wherein after curing the composition exhibits thermal stability measured using thermal shock from −40° C. to 125° C. after 1000 hour cycles.

16. The composition of claim 1, wherein after curing the composition exhibits Shore 00 hardness in the range of 45-60.

17. A heat-generating component or a heat sink comprising the composition of claim 1 disposed thereon.

18. An electronic device comprising a heat-generating component, a heat sink, and the composition of claim 1 disposed therebetween.

19. The electronic device of claim 18, wherein there is no air disposed between the heat-generating component and the heat sink.

20. The electronic device of claim 19, wherein the composition is applied on the heat-generating component or the heat sink via two-component (2K) mixing system.

21. An electronic device comprising a heat-generating component, a heat sink, and the composition of claim 1 disposed therebetween, wherein after curing the composition exhibits Shore 00 hardness in the range of 45-60 and thermal conductivity of at least 3 W/mK.

* * * * *